United States Patent [19]
Nguyen

[11] Patent Number: 5,973,932
[45] Date of Patent: Oct. 26, 1999

[54] SOLDERED COMPONENT BONDING IN A PRINTED CIRCUIT ASSEMBLY

[75] Inventor: Tuan D. Nguyen, San Diego, Calif.

[73] Assignee: Pulse Engineering, Inc., San Diego, Calif.

[21] Appl. No.: 08/801,825

[22] Filed: Feb. 14, 1997

[51] Int. Cl.[6] .............................. H05K 1/14; H05K 1/16; H05K 1/18
[52] U.S. Cl. ............................. 361/779; 174/261
[58] Field of Search ..................... 174/250, 260, 174/261, 263–266; 228/180.21, 180.22, 179.1, 180.1; 257/693, 697, 723, 724, 737, 738, 772, 778, 779; 361/760, 772, 777, 779, 782, 783; 439/68, 83

[56] References Cited

U.S. PATENT DOCUMENTS

| | | | |
|---|---|---|---|
| 3,439,411 | 4/1969 | Lloyd et al. | 29/499 |
| 4,855,810 | 8/1989 | Gelb et al. | 257/772 |
| 4,940,181 | 7/1990 | Juskey, Jr. et al. | 228/180.2 |
| 5,684,677 | 11/1997 | Uchida et al. | 174/261 |

FOREIGN PATENT DOCUMENTS

| | | |
|---|---|---|
| 0 568 087 A2 | 11/1993 | European Pat. Off. . |
| 0 652 072 A1 | 5/1995 | European Pat. Off. . |
| 743 879 | 1/1944 | Germany . |
| 26 50 348 | 5/1978 | Germany . |
| 41 10 373 A1 | 10/1991 | Germany . |
| 03204194 | 9/1991 | Japan . |
| 04342185 | 11/1992 | Japan . |
| 07176675 | 7/1995 | Japan . |
| 7 176675 | 7/1995 | Japan . |
| 08330702 | 12/1996 | Japan . |
| WO 93/03884 | 3/1993 | WIPO . |

OTHER PUBLICATIONS

*Electri–onics Desk Manual* (1985/1986), "Laminated Plastics, Unclad", pp. 101–106.

*Primary Examiner*—Donald Sparks
*Attorney, Agent, or Firm*—Knobbe, Martens, Olson & Bear, LLP

[57] ABSTRACT

A printed circuit assembly comprises a module with a component secured to a pad on a dielectric substrate using a tin-free metal composition. A terminal of the module is coupled to a second printed circuit board with a solder composition of at least approximately 40% tin. The tin-free solder composition may comprise approximately 90% lead and 10% antimony.

6 Claims, 3 Drawing Sheets

SOLDERED COMPONENT BONDING IN A PRINTED CIRCUIT ASSEMBLY

BACKGROUND OF THE INVENTION

1. Field of the Invention

The present invention relates to the field of printed circuit assembly construction. More specifically, the present invention relates to component and lead soldering techniques for preventing solder reflow during serially performed soldering steps.

2. Description of the Related Technology

In the manufacture of electrical and electronic products, it is essentially universal practice to create circuits by soldering components to printed circuit boards which incorporate conductive traces interconnecting the components in the desired manner. In some instances, components are individually hand soldered to their appropriate locations. In other applications, several components are placed on a printed circuit board at once, and are soldered in place essentially simultaneously by a wave soldering method, or by an infrared or convection oven reflow technique. Reflow methods are especially common in printed circuit assemblies which include surface mount components.

In a typical reflow procedure, the pads of the printed circuit board traces are coated with a solder paste by a stencil or screening process. Circuit components such as resistors, capacitors, and the like are then secured to their appropriate positions, typically with a small amount of adhesive. The assembly is then placed inside an oven, where the solder paste is raised to a temperature above its temperature of "liquidus", the temperature at which the solder is completely liquid. Upon cooling, the solder solidifies, securing the components to the pads.

In many modern electronic applications, a printed circuit assembly as described above is packaged or encapsulated to form a single electronic module having terminals and/or leads for external connection to other circuitry. Such a module can be then used as a component of another, "downstream", printed circuit assembly. In this case, the terminals or leads of the module are soldered to another printed circuit board at a downstream manufacturing facility. This soldering process may again comprise hand, wave, or reflow soldering techniques. It can be appreciated that during this subsequent soldering procedure performed on the module, it is desirable to have the solder internal to the module remain below its temperature of "solidus", the temperature at which the solder alloy is entirely solid. If the solder internal to the module is raised above the solidus temperature, migration and cracks will begin to form, reducing the stability of the internal solder connections. If the liquidus temperature is approached, the solder internal to the module may reflow again, forming internal short circuits and causing module failure.

Efforts to resolve this problem have focused on the use of a module solder system which have higher solidus and liquidus temperatures than the soldering system used to secure the module to the other printed circuit board. Most common solders use alloys of tin (Sn) and lead (Pb) having a solidus temperature of approximately 183 degrees C. A 63% tin, 37% lead (63 Sn/37 Pb) alloy is a common formulation, and ratios can often range from 40% to 60% Pb, with the balance being Sn. Although these tin-lead alloys are most common, other elements can be added or substituted for all or part of the Pb or Sn to produce solders with different mechanical strengths, grain sizes, or liquidus/solidus temperatures. Such elements include, for example, cadmium (Cd), bismuth (Bi), antimony (Sb), and silver (Ag).

Most downstream printed circuit assembly manufacturers use a Sn/Pb alloy solder at a reflow oven temperature of approximately 220 to 235 degrees C. To try to avoid module reflow under these oven conditions, a higher temperature module soldering system using an 85 Pb/10 Sb/5 Sn has been employed in some commercially available prior art modules. This solder has a solidus temperature of approximately 239 degrees C., and a liquidus temperature of approximately 243 degrees C. Even though modules using this solder alloy have been produced using pads plated first with nickel and then gold (thereby eliminating the thin coating of Sn/Pb solder typically placed on bare copper printed circuit board pads), these modules have been found to exhibit undesired solder reflow and its associated module failure in many downstream manufacturing environments which use standard Sn/Pb solder alloys.

Another prior art system, one that is currently produced by the assignee of the present application, uses 88 Pb/10 Sn/2 Ag solder on pads treated with a standard Sn/Pb solder dip rather than nickel and gold plate. The 88 Pb/10 Sn/2 Ag solder alloy has a liquidus temperature of approximately 299 degrees C. This solder does not have subsequent reflow problems in downstream manufacturing, but the initial reflow temperature of 320 to 330 degrees C. required with this solder renders the use of expensive high temperature printed circuit boards 30 such as epoxy/polyphenylene oxide resin boards, available, for example, as type GETEK (TM) from General Electric. This high initial reflow temperature also tends to over-stress the components mounted on the printed circuit board 30, as they are commonly rated by component manufacturers to withstand only approximately 260 degrees C. during soldering.

There is accordingly a need in the art for an improved module soldering system which does not have reflow problems during downstream incorporation into another printed circuit assembly which utilizes standard Pb/Sn soldering methods. The module soldering technique should also use a reflow temperature which can be tolerated by standard inexpensive printed circuit boards and circuit components.

SUMMARY OF THE INVENTION

In one aspect of the present invention, a lead-antimony alloy solder is utilized which has liquidus and solidus temperatures that avoid both subsequent reflow problems and component over-stress.

Benefits in printed circuit assembly reliability created by the present invention are especially apparent when printed circuit assemblies in accordance with the principles described above are incorporated into additional printed circuit assemblies during subsequent manufacturing steps. Accordingly, the present invention additionally comprises a module which includes (1) a first printed circuit board comprising a dielectric substrate and a plurality of conductive traces, (2) a terminal having a portion coupled to one of the plurality of conductive traces, and (3) a circuit component secured to a pad on one of the traces with a first solder composition which excludes tin. In addition, a second printed circuit board comprising a dielectric substrate and a plurality of conductive traces is provided, wherein a portion of the terminal of the module is coupled to one of the plurality of conductive traces on the second printed circuit board with a second solder composition comprised of approximately 40% or greater of tin. In preferred embodiments of this assembly, reflow of the tin containing solder does not affect the integrity of the non-tin containing solder bonds of the module.

DETAILED DESCRIPTION OF THE PREFERRED EMBODIMENT

Preferred embodiments of the present invention will now be described with reference to the accompanying Figures, wherein like numerals refer to like elements throughout. The terminology used in the description presented herein is intended to be interpreted in its broadest reasonable manner, even though it is being utilized in conjunction with a detailed description of certain specific preferred embodiments of the present invention. This is further emphasized below with respect to some particular terms used herein. Any terminology intended to be interpreted by the reader in any restricted manner will be overtly and specifically defined as such in this specification.

Figure 1:
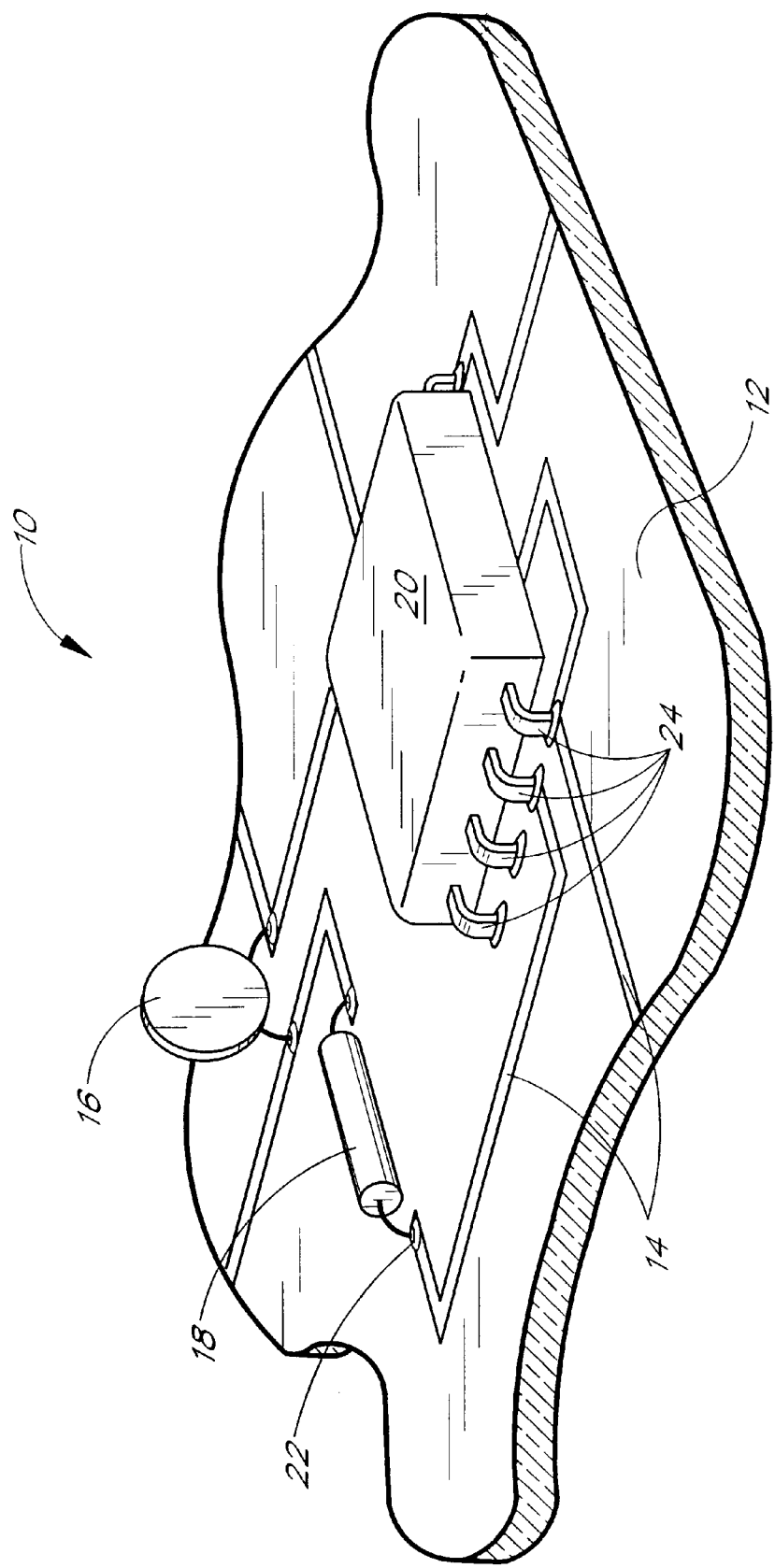
FIG. 1 is a perspective view of a printed circuit assembly according to one aspect of the present invention.

In FIG. 1, a portion of a printed circuit assembly 10 is illustrated. The printed circuit assembly 10 comprises a printed circuit board 12 made of a dielectric material that may comprise a wide variety of materials and constructions well known to those of skill in the art. Some known alternatives include laminated paper/phenolic and glass/epoxy formulations. Copper traces 14 are provided on at least one surface of the printed circuit board, and are often also provided on the opposite side and on internal laminations of the printed circuit board 12. The traces 14 provide conductive electrical connections between components mounted to the printed circuit board 12 such as the capacitor 16 and resistor 18 illustrated in FIG. 1. Typically, the components 16, 18 are soldered to the pads 22 of the traces 14, either with leads inserted into through-holes in the printed circuit board 12 or on the circuit board surface if the component is intended for surface mount.

In many printed circuit assembly applications, a packaged or encapsulated module 20 forms part of the final printed circuit assembly. Many different types of encapsulated modules are presently available, including devices such as optical isolators, amplifiers, digital logic circuits such as gate arrays or processors and the like. In some cases, the encapsulated module 20 will itself include an internal printed circuit board with solder mounted components. In communications applications, for example, it has become increasingly common to encapsulate inductive components such as telephone line interface transformers, high inductance common mode chokes, two wire digital interface transformers, and other similar components and circuits. Such components are typically soldered to a printed circuit board and encapsulated for subsequent incorporation into a "downstream" printed circuit assembly as illustrated in FIG. 1. In these cases, the printed circuit board internal to the encapsulated module 20 has its own traces which connect to terminals 24 which may form leads out of the encapsulation. These leads are then soldered to the printed circuit board 12 in a manner similar to that described with respect to the above-mentioned components such as the resistor 16 and the capacitor 18. Of course, those of skill in the art will appreciate that the type of circuitry present in the module can vary, and the scope of the present invention is not in any way limited to the nature of the components or circuits provided in the encapsulation. As with the components 16, 18, the encapsulated module 20 may be for through-hole mounting, or surface mount.

In some embodiments of the present invention, the components 16, 18, and the encapsulated module 20 are soldered to the printed circuit board with a Sn/Pb alloy solder having a solidus temperature of approximately 183 degrees C. As mentioned above, soldering of the printed circuit assembly 10 may be accomplished with hand soldering, wave soldering, or with an IR or convection oven reflow technique. The oven reflow methods are most commonly performed when the printed circuit assembly 10 comprises a large number of surface mount components. During an oven reflow process with Sn/Pb solder having a solidus temperature of 183 degrees C., the reflow oven temperature is typically approximately 220 to 240 degrees C. This ensures that all of the solder is raised above the liquidus temperature so that sufficient wetting and intermetallic bonding will occur.

Figure 2:
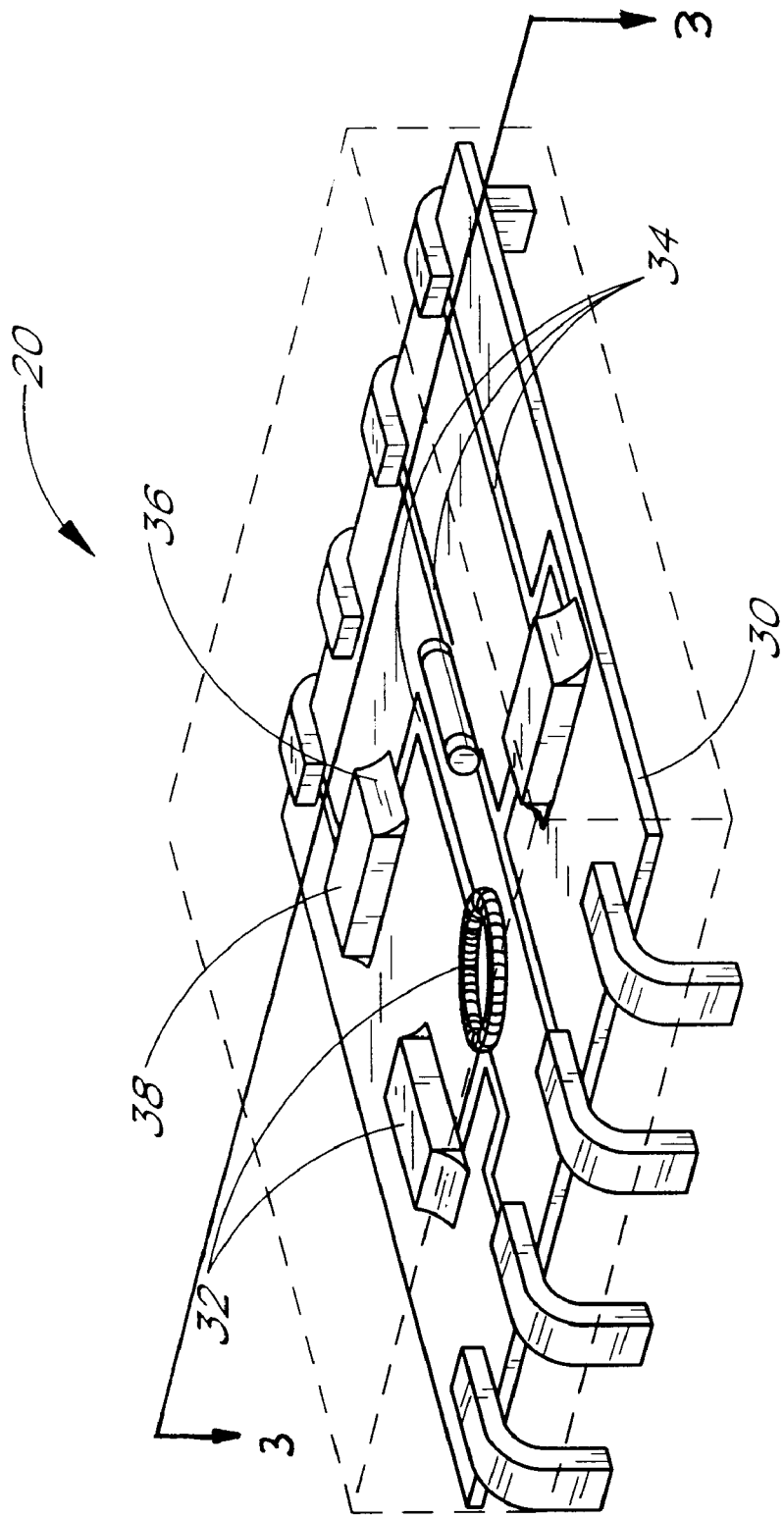
FIG. 2 is an internal perspective view of one subassembly which is part of the printed circuit assembly of FIG. 1.

FIG. 2 illustrates the internal structure of an encapsulated module 20 according to one aspect of the present invention. The module 20 comprises a printed circuit board 30 with components such as inductors and/or resistors 32 soldered to pads on traces 34 on the surface of the printed circuit board 30. As a specific example, illustrated also in FIG. 3 and described in more detail below, a surface mount resistor 38 is secured to a pad on a trace by a solder bond 36. Internal construction of the module 20 may thus be similar in many ways to the downstream printed circuit assembly illustrated in FIG. 1.

Due to size considerations, surface mount components are generally used for many components in encapsulated modules 20 of the type illustrated in FIG. 2. Surface mount components are generally bonded to the printed wiring board by screening solder paste onto selected locations of the printed circuit board and securing the component to the board in appropriate relation to the screened on solder paste via adhesive. The entire assembly is then usually placed in a reflow oven to raise the solder above its liquidus temperature. Upon cooling, the solder bonds are formed. Non-surface mount components, like typical inductors, are hand soldered to the printed circuit board 30 following the oven reflow procedure.

After incorporation into the downstream printed circuit assembly 10, the module 20 may again be placed into a reflow oven. Accordingly, the solder system used to secure components to the printed circuit board 30 inside the encapsulated module 20 should withstand the temperature found in subsequent soldering steps without bond weakening through partial or total solder reflow within the module 20. Prior art attempts to prevent this undesirable reflow in the module 20 have included significant drawbacks. Thus, a solder formulation should have a sufficiently high solidus temperature to remain solid in subsequent soldering procedures. While it is true that many solder formulations have solidus temperatures well above the typical 220 to 240 degree C. used in downstream reflow soldering operations, the liquidus temperature of the solder used in the module 20 should also be low enough that the necessary oven temperature used to perform the initial reflow process on the module 20 does not damage either the printed circuit board 30 or the components 32, 38. As mentioned above, attempts at finding suitable soldering systems which satisfy these needs have, prior to the present invention, been unsuccessful as to one or the other requirements.

Figure 3:
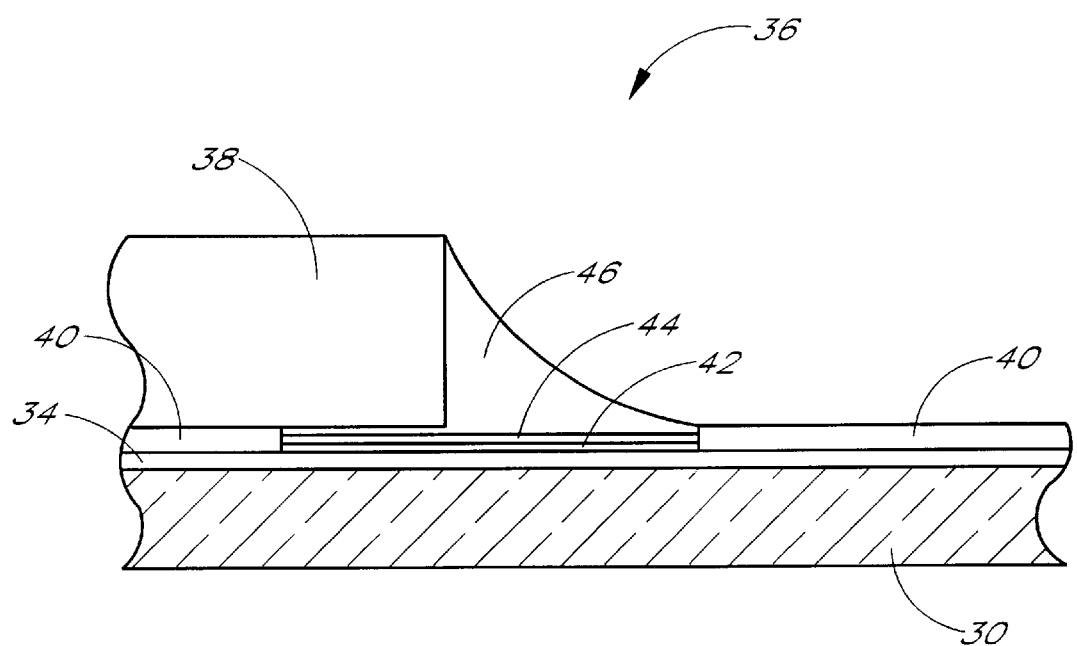
FIG. 3 is a cross sectional view taken along lines 3—3 of FIG. 2 of a solder bond in the module of that Figure.

An improved solder bonding system which avoids these disadvantages of the prior art is illustrated in FIG. 3, which shows a cross sectional view of one surface mount component 38 of FIG. 2 bonded to the printed circuit board 30. Referring therefore to FIG. 3, the printed circuit board 30 includes a trace 34, preferably of copper. The trace thickness will vary with the required current capacity of the connection, but a thickness of approximately 1.4 mil is suitable for many applications. Except at the pad region, the trace 34 is covered with a layer of solder mask 40 which may suitably be approximately 1.5 to 2.0 mil thick. The component 38 is secured to the printed circuit board 30 to a pad on the trace with a suitable quantity of solder 46. Preferably, the metal content of the solder 46 is approximately 90% lead and 10% antimony (90 Pb/10 Sb). Generally, the solder 46 is applied as a quantity of solder paste having a mesh size of −200+325, a metal content of 92%, and comprising a water soluble or RMA flux.

The 90 Pb/10 Sb solder composition has a solidus temperature of approximately 252 degrees C., and a liquidus temperature of approximately 260 degrees C. This solder composition thus has a solidus temperature slightly higher than the 220–240 degrees C. typically encountered in subsequent downstream incorporation into a second printed circuit assembly. Furthermore, the liquidus temperature of the 90 Pb/10 Sb solder is at a temperature which inexpensive printed circuit board 30 material and electrical components can tolerate without significant harmful effects.

It may be noted that initial experiments with 90 Pb/10 Sb solder were not particularly encouraging. In many trial modules, reflow during downstream manufacturing processes recurred when 90 Pb/10 Sb solder paste was substituted for 88 Pb/10 Sn/2 Ag solder paste. However, additional experimentation revealed that the performance of the 90 Pb/10 Sb system improved significantly if the pads on the printed circuit board were gold plated rather than dipped in a Pb/Sn solder bath to coat the pads. Accordingly, preferred embodiments of the present invention provide a pad comprising a portion of the trace 40 having a first layer of nickel 42 plated thereon. The nickel thickness can vary widely, but is preferably between approximately 80 and 120 microinches thick. On top of this nickel film 42, a gold plating is provided, preferably approximately 5 to 10 microinches thick. During the reflow process, the gold layer evaporates into the solder alloy, and a strong intermetallic bond is formed with the nickel. Though the solder bond is actually formed with the nickel layer, the gold is provided to prevent nickel oxidation which occurs rapidly when nickel is exposed to air, and which would interfere with solder bond formation during the reflow process. It can be appreciated that the layers illustrated in FIG. 3 are not drawn to scale for clarity, and are shown much thicker than they would actually appear in visual inspection.

The substitution of a gold-solder alloy interface for an interface comprising the 90 Pb/10 Sb alloy and the Pb/Sn coating often provided on bare circuit boards apparently stabilizes the solid phase of the 90 Pb/10 Sb alloy, thereby raising the solidus temperature enough to prevent the initially observed reflow problems. Furthermore, the liquidus temperature of the 90 Pb/10 Sb alloy remains low enough that the initial reflow step in the manufacture of the module 20 does not over-stress standard printed circuit board materials or circuit components such as resistors and capacitors.

Manufacture of a preferred encapsulated module according to one aspect of the present invention therefore begins with plating pads on the printed circuit board with a nickel film 42 and a gold film 44 as described above. Solder paste including a 90 Pb/10 Sb solder alloy is screened onto appropriate locations on the printed circuit board. Components are placed on the printed circuit board with the solder paste, and the assembly is placed in an IR or convection oven for reflow soldering of the components at a temperature of approximately 280 to 290 degrees C. This ensures that all of the solder (having a liquidus temperature of approximately 260 degrees C.) is completely molten and the appropriate surfaces are wetted with the solder alloy. After cooling and bond formation, the printed circuit board 30 is encapsulated to form the module 20.

Subsequent downstream manufacturing operations may then take place to incorporate the module onto another printed circuit board. In most common cases, a Pb/Sn alloy solder system will be used for this downstream operation. The oven temperatures used in these downstream operations of typically 220 to 240 degrees C., will not raise the temperature of the solder in the module to above the solidus temperature of approximately 252 degrees C., thereby preventing migration or reflow of the module solder during the downstream manufacturing process. Accordingly, the invention described and claimed herein overcomes the aforementioned problems in the art by providing a solder system which avoids reflow in downstream manufacturing, but which can be used with inexpensive printed circuit board material and circuit components.

The foregoing description details certain preferred embodiments of the present invention and describes the best mode contemplated. It will be appreciated, however, that no matter how detailed the foregoing appears in text, the invention can be practiced in many ways. As is also stated above, it should be noted that the use of particular terminology when describing certain features or aspects of the present invention should not be taken to imply that the broadest reasonable meaning of such terminology is not intended, or that the terminology is being re-defined herein to be restricted to including any specific characteristics of the features or aspects of the invention with which that terminology is associated. The scope of the present invention should therefore be construed in accordance with the appended claims and any equivalents thereof.

What is claimed is:

1. A printed circuit assembly comprising;
    a module, said module comprising (1) a first printed circuit board comprising a dielectric substrate and a plurality of conductive traces, (2) a terminal having a portion coupled to one of said plurality of conductive traces, and (3) a circuit component secured to a pad on one of said traces with a first solder composition, wherein said first solder composition comprises a tin-free metal composition;
    a second printed circuit board comprising a dielectric substrate and a plurality of conductive traces, wherein a portion of said terminal of said module is coupled to one of said plurality of conductive traces on said second printed circuit board with a second solder composition, wherein the metal content of said second solder composition is comprised of at least approximately 40% tin.

2. The printed circuit assembly of claim 1, wherein said module is encapsulated.

3. The printed circuit assembly of claim 1, wherein said first solder composition solder has a solidus temperature of greater than approximately 250 degrees C.

4. The printed circuit assembly of claim 3, wherein said first solder composition comprises approximately 90% lead and 10% antimony.

5. The printed circuit assembly of claim 1, wherein said pad comprises a layer of gold.

6. The printed circuit assembly of claim 5, wherein said pad comprises a layer of copper having a layer of nickel and a layer of gold plated thereon.

* * * * *